United States Patent
Snider

(10) Patent No.: US 7,203,789 B2
(45) Date of Patent: Apr. 10, 2007

(54) ARCHITECTURE AND METHODS FOR COMPUTING WITH RECONFIGURABLE RESISTOR CROSSBARS

(75) Inventor: Gregory Stuart Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 381 days.

(21) Appl. No.: 10/842,762

(22) Filed: May 10, 2004

(65) Prior Publication Data

US 2005/0258872 A1 Nov. 24, 2005

(51) Int. Cl.
*G06F 13/00* (2006.01)

(52) U.S. Cl. .................. 710/317; 326/326; 326/26; 326/41; 326/114; 977/708

(58) Field of Classification Search ............... 326/26, 326/39, 41, 104, 112, 114; 710/317; 977/708
See application file for complete search history.

(56) References Cited

U.S. PATENT DOCUMENTS

| | | | |
|---|---|---|---|
| 6,002,268 A * | 12/1999 | Sasaki et al. | 326/41 |
| 6,128,214 A * | 10/2000 | Kuekes et al. | 365/151 |
| 6,256,767 B1 | 7/2001 | Kuekes et al. | |
| 6,314,019 B1 | 11/2001 | Kuekes et al. | |
| 6,459,095 B1 | 10/2002 | Heath et al. | |
| 6,512,119 B2 | 1/2003 | Bratkovski et al. | |
| 6,518,156 B1 | 2/2003 | Chen et al. | |
| 6,541,309 B2 * | 4/2003 | Chen | 438/118 |
| 6,559,468 B1 | 5/2003 | Kuekes et al. | |
| 6,624,002 B2 | 9/2003 | Bratkovski et al. | |
| 6,663,797 B2 | 12/2003 | Bratovski et al. | |
| 6,674,932 B1 | 1/2004 | Zhang et al. | |
| 2004/0041617 A1 * | 3/2004 | Snider et al. | 327/365 |

FOREIGN PATENT DOCUMENTS

WO    WO 01/03208    1/2001

OTHER PUBLICATIONS

"Design and Analysis of Crossbar Circuits for Molecular Nanoeletronics" M. Ziegler, M. Stan, The IEEE Nanotechnology Conference Washington D.C., Aug. 2002.*
Ziegler, M M et al—"CMOS/Nano Co-Design for Crossbar-Based Molecular Electronics Systems"—IEEE Transactions on Nanotechnology vol. 2 No. 4 Dec. 4, 2003—pp. 217-230.
Chen Y et al—"Nanoscale Molecular-Switch Crossbar Circuits"—Nanotechnology, Institute of Physics vol. 14 No. 4 2003—pp. 462-468 Mar. 2003.
Collier C P et al—"Electronically Configurable Molecular-Based Logic Gates"—American Association for the Advancement of Science vol. 285 No. 5426 Jul. 16, 1999—pp. 391-394.
Nanotech Planet, "Nanosys founder publishes research describing bottom-up assembly of nanoscale logic device elements," Nov. 9, 2001, http://www.nanoelectronicsplanet.com/features/article/0,,6571_920771,00.html.

(Continued)

Primary Examiner—Rexford Barnie
Assistant Examiner—Jason Crawford

(57) ABSTRACT

An architecture for computing includes nanometer scale crossbar switches configured to perform a logical function in response to a sequence of pulses that encode logic values in the nanometer scale crossbar switches as impedances.

36 Claims, 9 Drawing Sheets

OTHER PUBLICATIONS

Nanosys, Inc., "Advances in Nanoelectronics by Nanosys Scientific Founders Honored as the Breakthrough of the Year by Science Magazine," Jan. 7, 2002, http://www.nanosysinc.com/images/Press%20Releases/Breakthrough%20Year%20-%20Jan%207%202002.pdf.

Matthew M. Ziegler, et al., "Scalability Simulations for Nanomemory Systems Integrated on the Molecular Scale," Jul. 2003, http://www.ece.virginia.edu/ mmz4s/papers/EngFdnConfPaper,8-03.pdf.

Mircea R. Stan, et al., "Molecular Electronics: From Devices and Interconnect to Circuits and Architecture," Proceedings of the IEEE, vol. 91, No. 11, Nov. 2003, pp. 1940-1957.

Matthew M. Ziegler, et al., "Design and Analysis of Crossbar Circuits for Molecular Nanoelectronics," downloaded Feb. 26, 2004, http://www.ece.virginia.edu/ mmz4s/papers/IEEEnano02_crossbar.pdf, Aug. 2002.

Matthew M. Ziegler, et al., "A Case for CMOS/nano Co-design," downloaded Feb. 26, 2004, http://www.acm.org/sigs/sigda/daforum/backup/03/Upload/Papers/matthewziegler_paper.pdf., Nov. 2002.

Hamid Mahmoodi-Meimand, "Molecular Field Programmable Gate Arrays (FPGAs)," downloaded Feb. 26, 2004, http://shay.ecn.purdue.edu/ ee612/2003fp/Hamid612.pdf.

* cited by examiner

Diode

NFET

PFET

Resistor logic "1"

logic "0"

driving latch   receiving latch
non-inverting configuration driving latch   receiving latch
inverting configuration

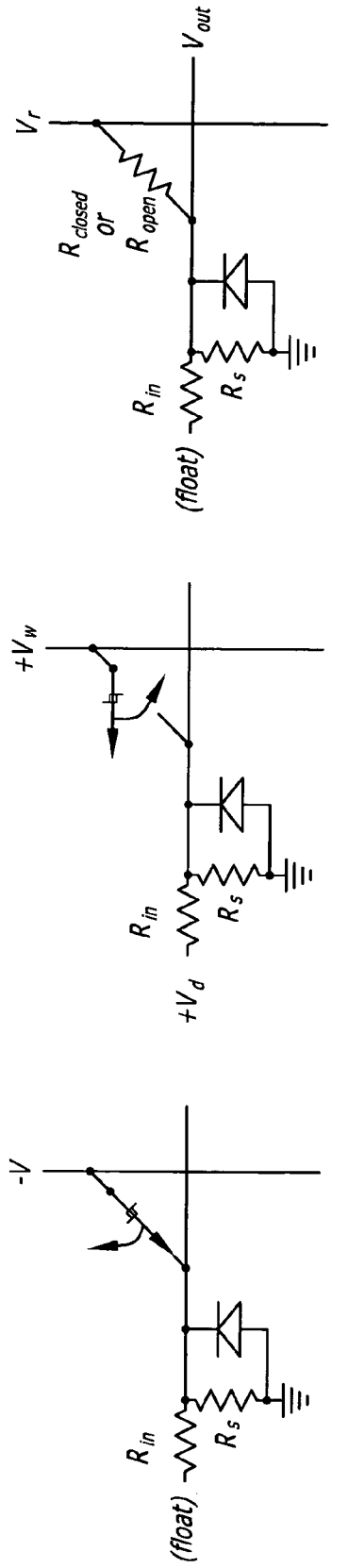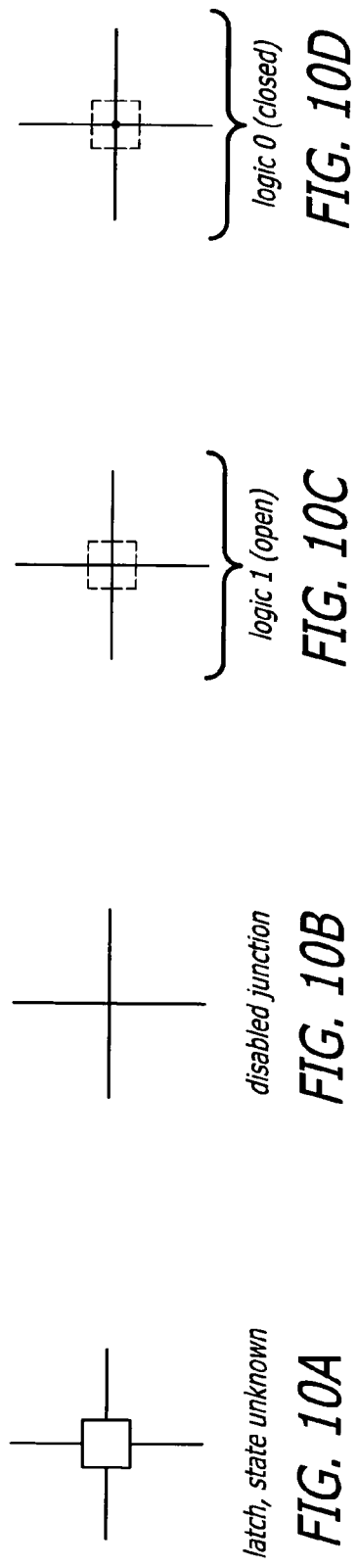

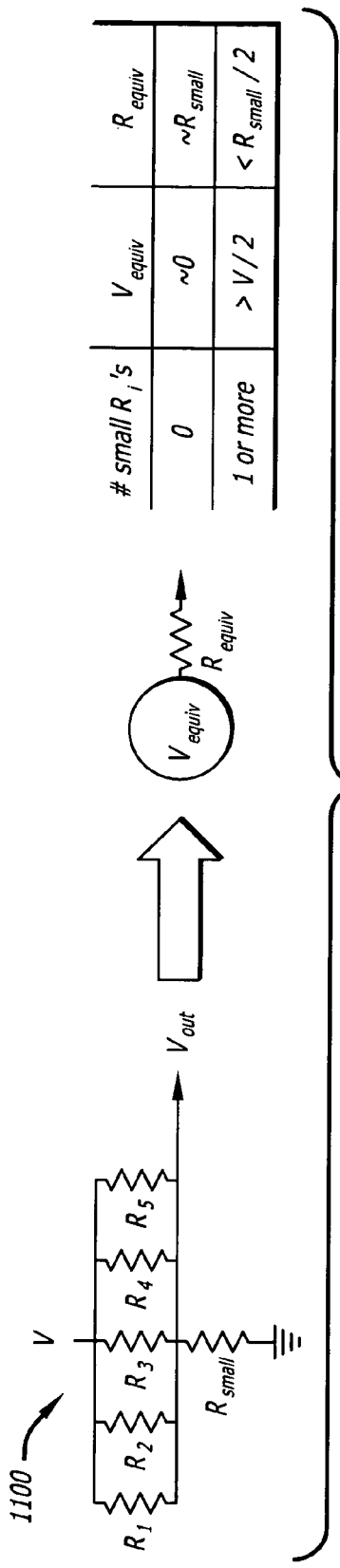
FIG. 11
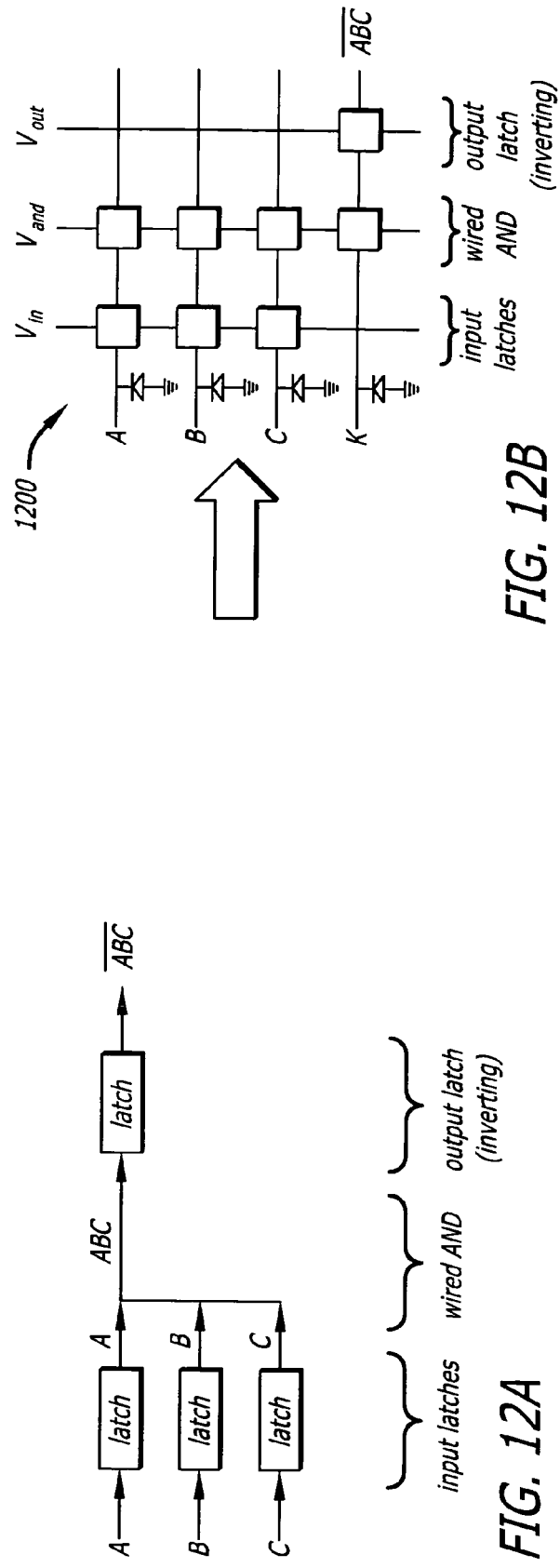
FIG. 12B
FIG. 12A

All latches opened

Input data latched

Wired-AND junctions closed

Wired-AND computed, latched

Wired-AND junctions opened

Result driven out

ARCHITECTURE AND METHODS FOR COMPUTING WITH RECONFIGURABLE RESISTOR CROSSBARS

TECHNICAL FIELD

The present invention relates generally to electronic devices whose functional length scales are measured in nanometers, and, more particularly, to devices used as building blocks to form more complicated structures, and to methods for using such devices. Electronic devices both of micrometer and nanometer scale may be constructed in accordance with the teachings herein.

BACKGROUND ART

The silicon (Si) integrated circuit (IC) has dominated electronics and has helped it grow to become one of the world's largest and most critical industries over the past thirty-five years. However, because of a combination of physical and economic reasons, the miniaturization that has accompanied the growth of Si ICs is reaching its limit. The present scale of devices is on the order of tenths of micrometers. New solutions are being proposed to take electronics to ever smaller levels; such current solutions are directed to constructing nanometer-scale devices.

Prior proposed solutions to the problem of constructing nanometer-scale devices have involved (1) the utilization of extremely fine scale lithography using X-rays, electrons, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a small fraction of the size of the device features in at least two dimensions for several successive stages of lithography, followed by etching or deposition to build the devices. This level of control does not scale well as device sizes are reduced to nanometer scale dimensions. It becomes extremely expensive to implement as devices are scaled down to nanometer scale dimensions. The major problem with (2) is that it is a serial process, and direct writing a wafer full of complex devices, each containing trillions of components, could well require many years. Finally, the problem with (3) is that high information content molecules are typically macromolecular structures such as proteins or DNA, and both have extremely complex and, to date, unpredictable secondary and tertiary structures that cause them to twist into helices, fold into sheets, and form other complex 3D structures that will have a significant and usually deleterious effect on their desired electrical properties as well as make interfacing them to the outside world impossible.

There remains a need for a basic approach to form nanometer-scale devices that can be used to form more complex circuits and systems, and that scale readily and cheaply down to nanometer-scale dimensions.

DISCLOSURE OF INVENTION

According to an example embodiment, an architecture for computing includes nanometer scale crossbar switches configured to perform a logical function in response to a sequence of pulses that encode logic values in the nanometer scale crossbar switches as impedances.

According to an example embodiment, an architecture for computing includes a plurality of nanometer scale switches which serve as resistive circuit elements when in closed positions, the nanometer scale switches being configured to perform a logical function in response to a sequence of control inputs that encode logic values in the nanometer scale switches as impedances.

According to an example embodiment, an architecture for computing includes arrays of crossbar switches that are uniform in type and that include a common type of programmable switch junction, the arrays being configured to implement a logic function by encoding logic values in the arrays as impedances.

According to an example embodiment, a method for computing includes providing a sequence of pulses that encodes logic values in arrays of crossbar switches as impedances such that the arrays perform logical functions.

BRIEF DESCRIPTION OF THE DRAWINGS

FIGS. 9A–9C illustrate inverting latch operation according to example embodiments;

FIGS. 10A–10D show schematic symbols for a single-junction latch;

FIG. 11 illustrates an example of "Wired-AND" logic implemented according to an example embodiment;

FIGS. 12A and 12B respectively illustrate an example of a latch based circuit for computing a logical NAND and its implementation in a crossbar according to an example embodiment;

BEST MODES FOR CARRYING OUT THE INVENTION

Definitions

Figure 1A:
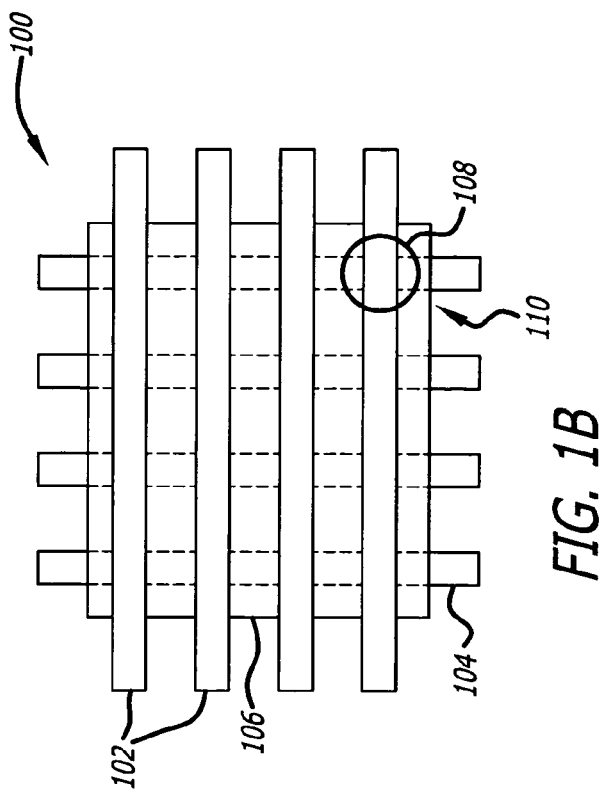
FIGS. 1A and 1B illustrate schematic views, from two different perspectives, of an array of a nano-scale crossbar according to an example embodiment.

As used herein, the term "reconfigurable" means that a switch can change its state multiple times via a reversible process such as an oxidation or reduction; in other words, the switch can be opened and closed multiple times, such as the memory bits in a random access memory (RAM).

A "latch" is a digital electronic component capable of storing a single bit of information. It has an input line, an output line and one or more control lines. Generally the control lines manipulate the latch to be in one of two modes: in "programming mode," the data on the input line is sampled and captured and stored in the memory element of the latch; in "output mode" (which may overlap "programming mode") the stored data value is driven out, perhaps with an inversion, onto the output data line. Thus, a latch is a storage device that can sample and save a logic signal while also providing a mechanism for restoring the electrical integrity of that signal.

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Basic Information on Crossed Wire Switches

Crossbars have been proposed as an architectural approach to nano-electronic computation. See, for example:

Y. Chen, G. Jung, D. Ohlberg, X. Li, D. Stewart, J. Jeppesen, K. Nielsen, J. Stoddart, R. Williams, "Nanoscale molecular-switch crossbar circuits," *Nanotechnology* 14 (2003), pages 462–468.

A. DeHon, "Array-Based Architecture for FET-Based Nanoscale Electronics," *IEEE Transactions on Nanotechnology*, vol. 2, no. 1, March 2003, pages 23–32.

M. Stan, P. Franzon, S. Goldstein, J Lach, M. Ziegler, "Molecular Electronics: From devices and interconnect to circuits and architecture," *Proceedings of the IEEE*, November 2003, pages 1940–1957.

S. Goldstein, M. Budiu, "NanoFabrics: Spatial Computing Using Molecular Electronics," *Proceedings of the 28th International Symposium on Computer Architecture*, ISCA, 2001.

Y. Luo, C. Collier, J. Jeppesen, K. Nielsen, E. Delonno, G. Ho, J. Perkins, H. Tseng, T. Yamamoto, J. Stoddart, J. Heath, "Two-Dimensional Molecular Electronics Circuits," *Chemphyschem* 2002, 3, pages 519–525.

J. Heath, M. Ratner, "Molecular Electronics," *Physics Today*, May 2003, pages 43–49.

See, also:

L. J. Guo, P. R. Krauss and S. Y. Chou: "Nanoscale silicon field effect transistors fabricated using imprint lithography," *Appl. Phys. Letts.* 71 (1997) 1881.

Y. Huang, X. F. Duan, Y. Cui, L. J. Lauhon, K. H. Kim and C. M. Lieber: "Logic gates and computation from assembled nanowire building blocks," Science 294 (2001) 1313.

Present Embodiments

Various embodiments employ arrangements (arrays or otherwise) of crossbars wherein the crossbar junctions are electrically reconfigurable with both a high- and low-impedance state, and selected junctions can be "disabled," leaving them in a high-impedance state that cannot be reconfigured. Crossbar junctions are also capable of implementing inverting or non-inverting latches. The crossbars are driven by waveforms from voltage sources that are capable of being placed in a high-impedance state. Multiple reconfigurable resistor crossbars can be combined, with some crossbars implementing latches and logic and others implementing routing, to create larger computational systems. Systems according to some embodiments have the advantage of requiring only a single tile type, thereby reducing the complexity and cost of their fabrication.

Figure 1B:
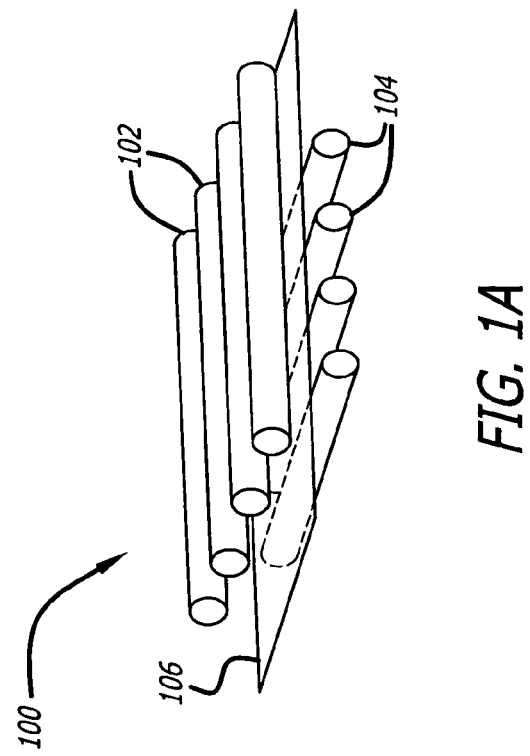
Figure 2A:
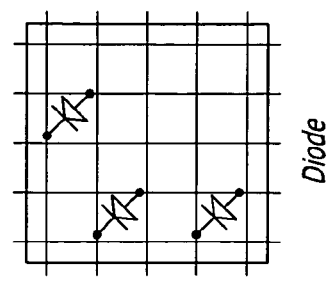
FIGS. 2A–2D illustrate examples of tiles with crossbar switches that have different electronic devices configured at their respective crossbar switches junctions.
Figure 2B:
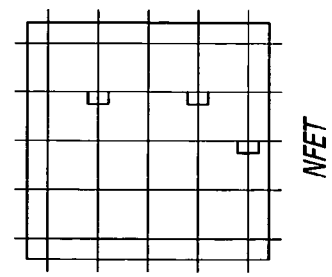
Figure 2C:
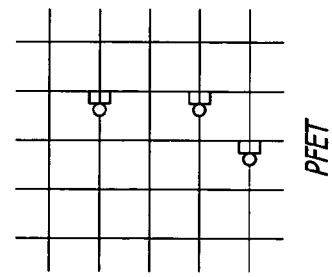
Figure 2D:
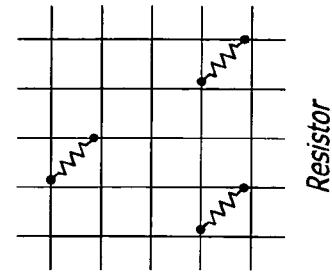

FIGS. 1A and 1B illustrate an example array 100 of nano-scale crossbar switches which define junctions that can be independently configured to behave as electronic devices. In this example, the array 100 of nano-scale crossbar switches is formed with two parallel planes of nanowire arrays (denoted nanowires 102 and 104, respectively) separated by an interlayer 106 as shown. In this example, the wires in one plane are orthogonal to the wires in the other, with each wire in a given plane being of the same type. The region where a wire in one plane crosses over a wire in the other is called a junction 108. A crossed wire switch or crossbar switch 110 is formed in each junction. The nanowire arrays 102 and 104 may be either metal or semiconductor (e.g., silicon) wires, that are crossed at some non-zero angle defining the junction 108. The interlayer 106 is a thin layer of material with particular electrochemical properties, for example, rotaxane. The interlayer 106 can be discontinuous, e.g., a collection of molecules. Example materials that can be used for the interlayer 106 are described in U.S. Pat. No. 6,459,095, U.S. Pat. No. 6,624,002 and U.S. Pat. No. 6,674,932, which are incorporated herein by reference. Depending on the nature of the interlayer 106 and the type of wires 102 and 104 used, the junction 108 can be configured (and possibly unconfigured) by applying suitable voltages to the two wires that form it to implement an electronic device, such as a diode (FIG. 2A), a field effect transistor (FIGS. 2B and 2C), or a resistor (FIG. 2D).

Figure 3:
FIG. 3 depicts a mosaic of tiles that has different interlayers in different regions of the crossbar.

Arrays (rectangular in shape, or otherwise) of crossbar switches called "tiles" can serve as building blocks for creating a nano-architecture. Conventionally, a particular type of tile has a single type of interlayer, and thus only a single device type is available for each tile (as exemplified in FIGS. 2A–2D). Tiles, in turn, can be used to form larger structures called "mosaics" which have different interlayers in different regions of the crossbar. For example, and referring to FIG. 3, a mosaic 300 includes interlayer regions 302 and 304 (bounded by dashed lines) configured to form resistive crosspoint switches, an interlayer region 306 (bounded by dashed lines) configured to form n-FETs, and an interlayer region 308 (bounded by dashed lines) configured to form p-FETs.

According to example embodiments, an architecture and methods for computing utilize only a single type of tile, i.e., only a single interlayer is used for an entire mosaic. In various embodiments, an architecture and methods for computing utilize nanometer-scale crossbar switches; however, it should be appreciated that the principles described herein are also applicable to switches of smaller or larger-scale dimensions (e.g., micro or sub-micron scale dimensions).

According to example embodiments, reconfigurable resistor crossbars are used as a basis for general computation. In various embodiments, specific junctions in the crossbar are permanently "disabled" by an appropriate mechanism. Depending upon the interlayer, the junctions may be destroyed by application of an excessive voltage such that the junctions are left in a permanent, high-impedance state (and thus no longer reconfigurable). In various embodiments, this disabling is only done once during the manufacturing process (e.g., when a circuit is first created).

Figure 6A:
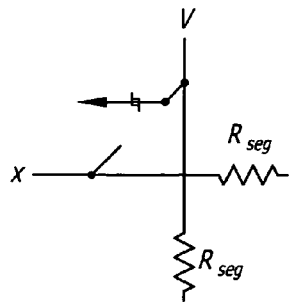
FIG. 6A depicts a latch electrical model consisting of a hysteretic switch of a junction plus "segment" resistances of the nanowires that define the junction.
Figure 6B:
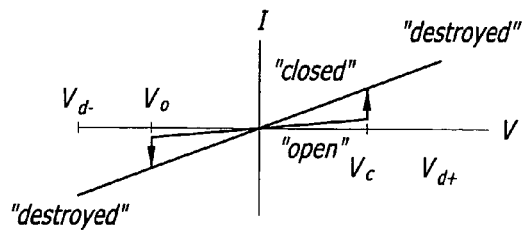
FIG. 6B depicts an idealized current/voltage curve for the latch electrical model of FIG. 6A.

The resistor crossbars are reconfigurable; their resistance abruptly changes when the voltage drop across them reaches a certain threshold. Moreover, the threshold for transitioning from low-to-high impedance is different from the threshold for high-to-low. Thus, as shown in FIGS. 6A and 6B (discussed below), the resistor crossbars exhibit hysteresis in their switching. Such properties provide non-linearity for implementing gain, signal inversion and data storage.

The two-terminal nature of resistors (which limits, for example, the ability to implement inversion and gain, which are typically necessary for implementing general logic) is circumvented through the time multiplexing of resources. For example, a given nanowire can function as an input to a component in one timeslot, an output in another timeslot, and as a summing junction in still another. A single voltage source driving a nanowire can be used to reconfigure junctions, establish connections, or drive output signals, depending upon the stage of the computation.

Figure 4:
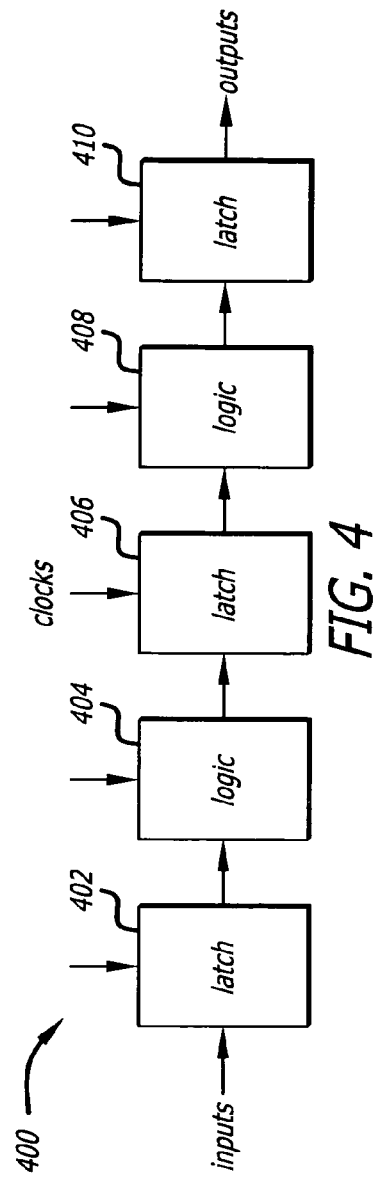
FIG. 4 illustrates a logic/latch cascade according to an example embodiment.

Referring to FIG. 4, a logic/latch cascade 400 according to an example embodiment includes latch elements 402, 406 and 410 and logic elements 404 and 408 configured as shown. In this example, input signals are latched, combined in logic to form additional signals which are then also latched. Data flows through the cascade 400 from left to right with each stage, whether logic or latch, being driven by clock signals in sequence in order to execute and propagate the computation. By way of example, each logic stage implements one or more AND-OR-INVERT gates. The latches can be either inverting or non-inverting and provide temporary storage of data, as well as a logical NOR function that is evaluated in a sequential (bit-serial) manner, and signal restoration.

Figure 5:
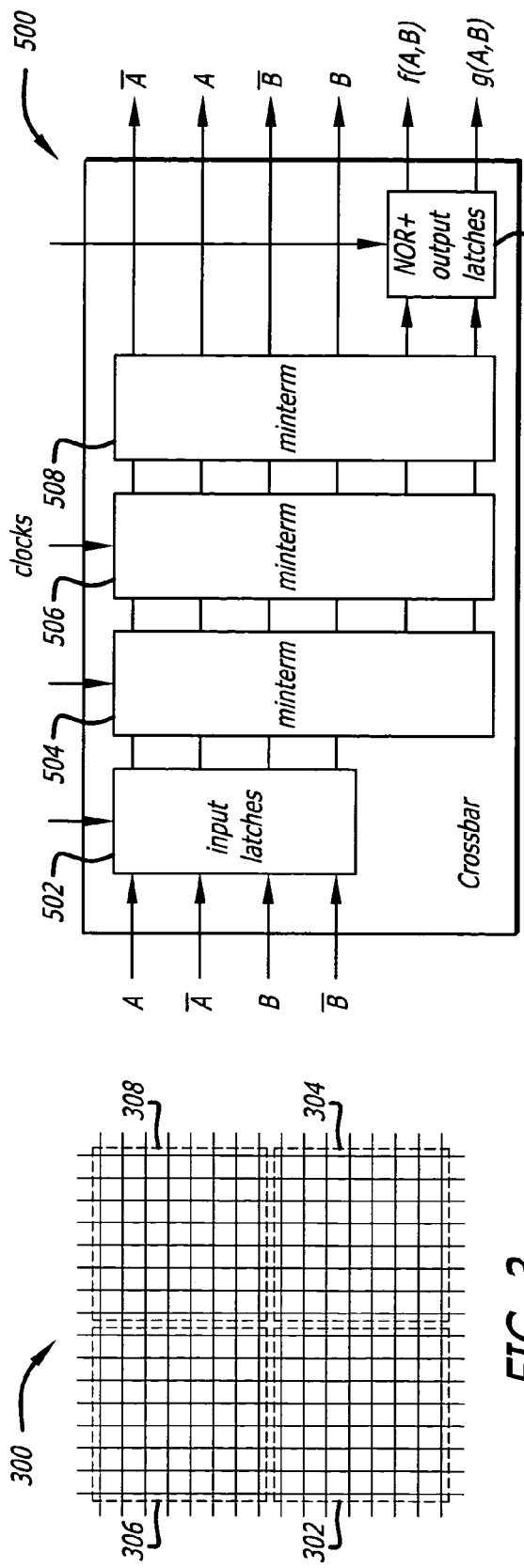
FIG. 5 illustrates an example reconfigurable resistor crossbar organization for computing and latching a sum-of-products computation.

According to an example embodiment, FIG. 5 depicts a crossbar 500 with input latches 502, minterm elements 504, 506 and 508, and output latches 510 configured as shown. The crossbar 500 is an example of one of many possible reconfigurable resistor crossbar organizations that can be implemented. In this example, the cascade 500 (for latching a sum-of-products computation) uses two latch stages and one computation stage. Input signals are brought in and latched in the input latch stage 502. Minterms (also called "products"—the logical ANDs of selected latched input signals) are computed one at a time, and the result of each minterm is accumulated in an output latch, effectively computing a logical NOR of each minterm result. The minterm functions are implemented by selectively "disabling" appropriate junctions within the minterm elements 504, 506 and 508 into a permanent high-impedance state. At the completion of the computation, the output latch 510 will hold the (inverted) sum-of-products results which can then be driven out for use by a following stage of logic or delivered to external circuitry.

A key aspect is the encoding scheme used for logic values. Instead of using voltages, as is often conventionally done, logic values are represented by impedances, for example, with a logic "0" represented by a low impedance, and a logic "1" represented by a high impedance. These values can be converted into voltages for interfacing with external circuitry or other computing elements. By way of example, this can be accomplished by connecting the junction resistor in series with another resistor (e.g., intermediate in value between the $R_{open}$ and $R_{closed}$ resistances of the junction) and driving a voltage across the series pair. By applying a voltage V and ground across the series, a voltage divider is provided that will effectively convert the impedance to a voltage. If the junction is low impedance, the output voltage $V_{out}$ will be close to V; if the junction is high impedance, $V_{out}$ will be close to ground.

Another key aspect of the architecture and methods described herein is the shared (multitasked) functionality of wires, which is implemented using voltage sources capable of being "disabled" or switched into a high impedance output state. For example, in various embodiments, a latch implemented according to principles described herein uses a single wire for both input and output, and enabled voltage drivers facilitate the sharing. In various embodiments, minterm logic blocks implemented according to principles described herein effectively tie multiple wires together in a manner similar to wired-OR logic. In various embodiments, although a cascade of logic and latches resembles a pipeline, its operation does not permit the entry of new input data into the stream until the entire computation is complete. In such embodiments, only two stages of latches can be actively driving and acquiring data at a time, with all other stages being in a disabled state. Such cascades effect functionality similar to that of a digital delay line with logic interspersed between the delay line stages.

Electrical Model

FIG. 6A depicts a latch electrical model consisting of a hysteretic switch of a junction plus "segment" resistances of the nanowires that define the junction; FIG. 6B depicts an idealized current/voltage curve for the latch electrical model of FIG. 6A. For purposes of this electrical model, each non-disabled junction in a crossbar is assumed to behave like a "hysteretic switch" as shown in FIGS. 6A and 6B. Such a switch is normally in one of two states: high impedance ("open") or low impedance ("closed"). The switch remains in whatever state it is in as long as the voltage drop across the switch (measured at "V" relative to "x" in FIG. 6A) remains in the operating range $[V_o, V_c]$ (FIG. 6B). In the "open" state, however, the switch will transition to the "closed" state if the voltage drop across the switch exceeds $V_c$; in the "closed" state, the switch will transition to the "open" state if the voltage drop is less than $V_o$. However, an excessive positive voltage drop ($V_{d+}$) or negative voltage drop ($V_{d-}$) across a junction will destroy it. A destroyed junction, it has been observed, is typically left in a "stuck closed" state.

For purposes of this simplified electrical model, the resistance of a "closed" junction is assumed to be 1 megohm (as measured on fabricated crossbars), while an "open" junction is assumed to be 1 gigohm. Both of these resistances are significantly higher than the resistance of the nanowire itself, which is on the order of 100 ohms per "segment" (as measured on fabricated crossbars), where a segment is the length of nanowire between two adjacent junctions. The "disabled" or "stuck open" junction state is assumed to have the same impedance as an "open" junction, 1 gigohm in this case.

Latches

Figure 7A:
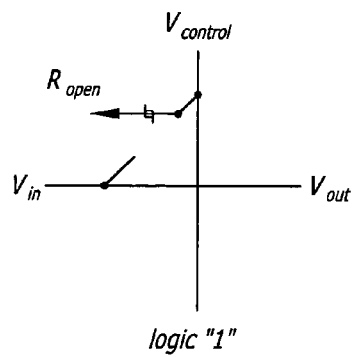
FIGS. 7A and 7B illustrate the impedance-encoding of logic values in a hysteretic switch junction used as a latch.
Figure 7B:
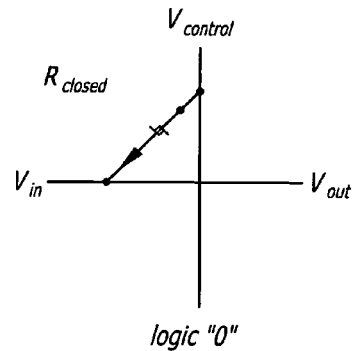

FIGS. 7A and 7B illustrate a hysteretic switch junction used as a latch. In this example, only a single junction in the crossbar is used for storing a bit. Moreover, another key aspect is that logic values for "0" and "1" are represented not with voltages but with the impedance of the junction implementing the latch. For example, an "open" (high-impedance) junction (FIG. 7A) represents a latched logical "1" and a "closed" (low-impedance) junction (FIG. 7B) represents a logical "0." In operation, the horizontal nanowire is time-shared by the input and output signals, and the vertical nanowire is used for both data acquisition and for driving the latched data signal onto $V_{out}$. As described below, this "impedance encoding" is also a key aspect of implementing logic functions.

Figure 8A:
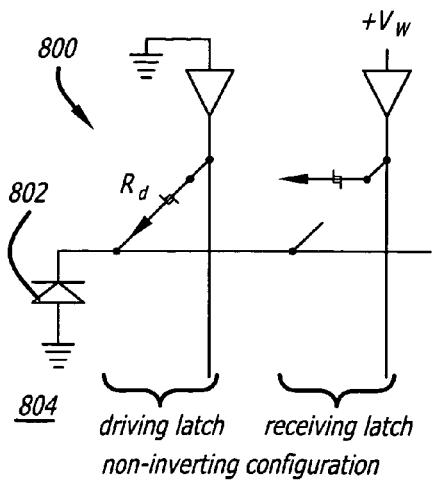
FIGS. 8A and 8B illustrate how a hysteretic switch latch can be used in non-inverting and inverting configurations, respectively, according to example embodiments.
Figure 8B:
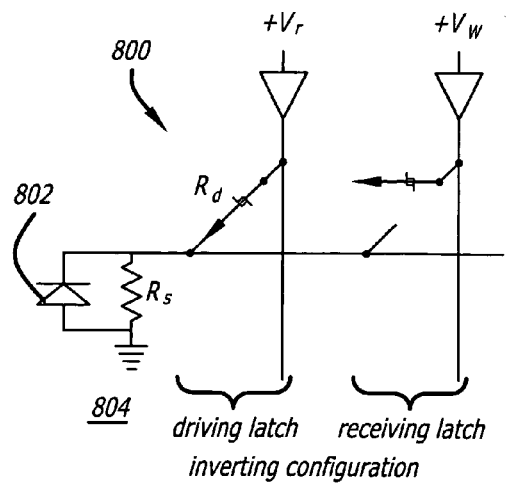

FIGS. 8A and 8B illustrate how a hysteretic switch latch can be used in non-inverting and inverting configurations, respectively, according to example embodiments. For the inverting configuration, the stored signal is the logical complement of the input signal. Different sequences of control voltages are used for each configuration. The input to a latch can be a simple voltage source (e.g., if the latch is interfaced to external CMOS circuitry). However, within a larger circuit the latch will most often be driven by the output of another latch; in this case, the input signal being represented by the impedance of the driving latch. By way of example, this impedance will be high (on the order of $R_{open}$) to represent a logic 1, or low (on the order of a small multiple of $R_{closed}$) to represent a logic 0. The voltage source driving this input impedance, $R_d$, on the vertical nanowire will either be "floating" (for example, a very high impedance>>$R_{open}$), ground, or a fixed positive voltage less than $V_c$, depending on the stage of latch operation. The output of the latch is the same horizontal nanowire used by the input. In the example embodiments shown in FIGS. 8A and 8B, the crossbar 800 is externally provided (electrically connected) with driving diodes 802 to prevent destruction of the junctions when the junctions switch from a closed to an open state. Thus, according to various embodiments, the crossbars are provided with arrays of external driving diodes—diodes that are not part of the crossbar. For example, such external driving diodes are fixed (non-configurable) and are provided on a substrate 804 that carries the crossbar. Thus, some embodiments facilitate the use of tiles (e.g., nano-scale tiles) that have only reconfigurable resistor crossbars. In other embodiments, the driving diodes can be provided on a tile of a different type.

FIGS. 9A–9C illustrate inverting latch operation according to example embodiments. First, the latch is preset into an "open" state (FIG. 9A) by unconditionally opening the junction switch. This is accomplished by forcing the input voltage source into the high impedance state, and then applying a negative voltage to the vertical nanowire such that the voltage drop across the junction exceeds the $V_o$ threshold required to open the switch. The diode in the circuit is forward biased only during this first step, and provides a low impedance path to ground to protect the junction. To appreciate why this protection is needed, consider what would happen if the diode were missing and instead the input signal was only grounded through the input resistor, $R_s$, with $R_s$ being the same value as the closed resistance of the switch, $R_{closed}$. If the junction is initially closed, it forms a voltage divider with $R_s$, forcing the negative voltage applied to the vertical nanowire to be at least twice the open threshold voltage, $V_o$, if the switch were to be opened. However, when this voltage is applied and the switch transitions to the high impedance state ($R_{open}$), the current through the voltage divider drops rapidly and nearly all of the voltage applied to the vertical nanowire, $2*V_o$, is now dropped across the junction. If this value exceeds the destruction threshold, $V_{d-}$, the junction is destroyed. The problem is even worse if $R_{in}$ is larger than $R_{closed}$, as is likely in any realistic circuit containing the latch. The diode thus provides a low impedance path that prevents the junction voltage from spiking destructively when the junction makes the transition to the high impedance state.

In the second step (FIG. 9B), the newly opened junction is conditionally closed depending on the logic value of the input signal, $V_{in}$. The horizontal input nanowire is driven with a fixed voltage, $V_{in}$, and the vertical nanowire is driven with a write voltage, $V_w$. If the input signal is a logic "1", the value of $R_{in}$ will be high (since it represents a latch from a previous stage which uses impedance encoding). The resistance of the junction, represented by the hysteretic switch 900, will be high, while $R_s$ is relatively low. The voltage, $V_w$, is chosen so that in this case the voltage drop across the junction exceeds $V_c$ and the junction will close. On the other hand, if the input signal is logic "0," the value of $R_{in}$ will be low, much lower than the $R_{open}$ value of the closed junction, and the formed voltage divider will assure that the voltage drop across the junction never exceeds the close threshold, $V_c$. Thus at the end of the second step, the junction has captured the inverted state of the input signal: a logic "1" input (high impedance) results in a logic "0" (low impedance) junction state, while a logic "0" input (low impedance) results in a logic "1" (high impedance) junction state.

In the third step (FIG. 9C), the state of the latch is read out onto the horizontal nanowire. This is accomplished by effectively disconnecting the input signal by forcing its voltage source driver into the high impedance state, and by driving the vertical nanowire with a "read" voltage, $V_r$.

The non-inverting latch configuration (FIG. 8A) eliminates the need for the pull-down resistor, $R_s$, when writing the value of one latch into another. As in the inverting case, the receiving latch must first be unconditionally opened. But the conditional closing of the second latch is accomplished by driving the vertical nanowire of the first latch with ground rather than a positive voltage, and the vertical nanowire of the receiving latch driven with a positive voltage greater than $V_c$ but less than $2V_c$. The junctions of the two latches then form a resistive voltage divider that will cause the second latch to open only if the first latch is open, thus replicating the state of that latch.

To simplify the remaining drawings, FIGS. 10A–10D show schematic symbols for a single-junction latch. A square covering a junction is used to represent a latch in an unknown state (FIG. 10A), and the absence of a square represents a latch that has been disabled, left in a permanent, high-impedance state (FIG. 10B). The symbols in FIGS. 10C and 10D represent a latch holding a logic 1 (open) and a latch holding a logic 0 (closed), respectively.

Logic

FIG. 11 illustrates an example of "Wired-AND" logic 1100 implemented according to principles described herein. If all of the resistors, $R_1$ through $R_5$, are large (>>$R_{small}$), then the Thevenin equivalent circuit will be a voltage source of approximately 0 volts with an output impedance of approximately $R_{small}$. However, if one or more of the resistors equals $R_{small}$ (all the rest being large), the equivalent output voltage will be greater than V/2 with an even smaller output impedance. This provides a good approximation of an AND logic function where input values are impedance encoded ($R_{small}$=logic 0, $R_{large}$=logic 1) and the output is voltage encoded (0V=logic 1, >V/2=logic 0). According to the principles described herein, logic evaluation exploits the fact that logic values are stored in latches as impedances rather than voltages. In this example, computation is achieved by shorting together multiple latch outputs to implement what is essentially a "wired-AND" function. The result of the "wired-AND" is fed to the input of another latch to capture and restore the logic signal.

NAND Gate

FIG. 12A illustrates an example of a latch based circuit for computing the logical NAND of three input signals, A, B, and C, each of which is assumed to be impedance encoded in a separate latch. The non-inverting input latches capture and regenerate the input signals. When the three input latches are driven on their shared, vertical nanowire by a common read voltage and the latch outputs (horizontal nanowires) are tied together to a small pull-down resistor, the result is either a low-impedance voltage source near ground (if all of the latches are in the open state) or a low-impedance voltage near or above $V_s/2$ (if at least one of the latches is in the closed state). These voltages are sufficient to successfully program the following latch (which is in an inverting configuration because of the voltage divider) by conditionally closing the junction in that latch.

FIG. 12B illustrates implementation of the logical NAND of FIG. 12A in a crossbar 1200 according to an example embodiment. In this example implementation, several of the crossbar junctions are "disabled" into a permanent high impedance state. Junctions covered by a white square represent working latches, while those not covered are junctions that have been "disabled" during the manufacturing or configuration process. The "K" input is a low impedance connection to ground implemented, for example, using a latch holding a logic 0 (closed).

Figure 13A:
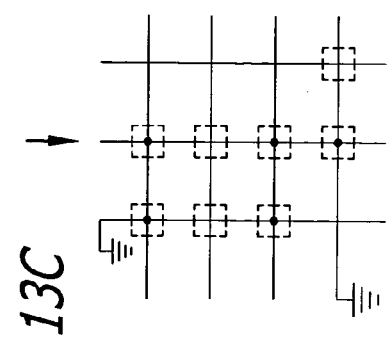
FIGS. 13A–13F illustrates steps in computing a NAND function with hysteretic logic according to an example embodiment.
Figure 13B:
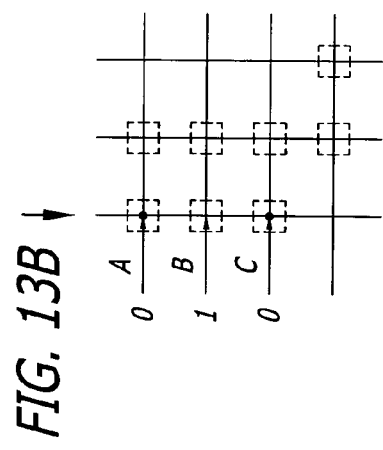
Figure 13C:
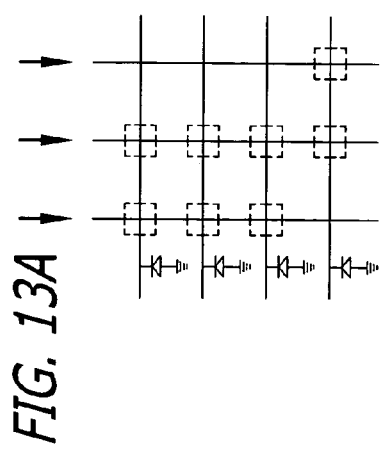
Figure 13D:
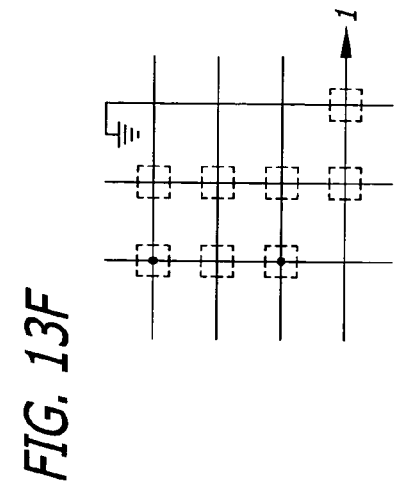
Figure 13E:
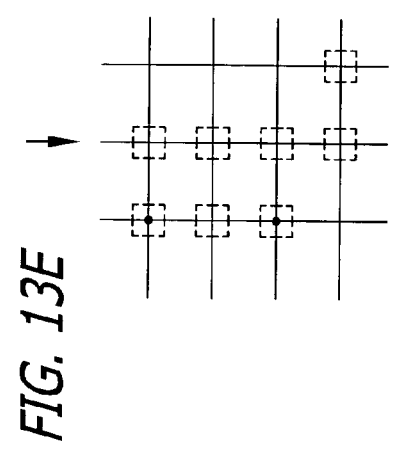
Figure 13F:
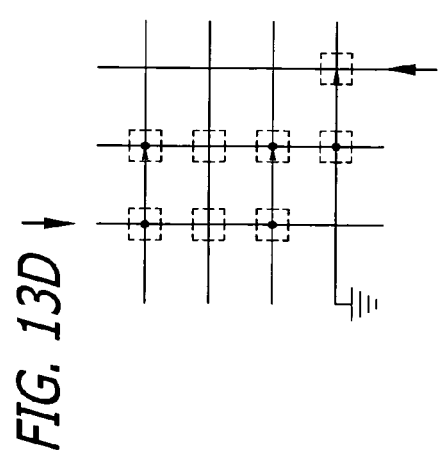
Figure 14:
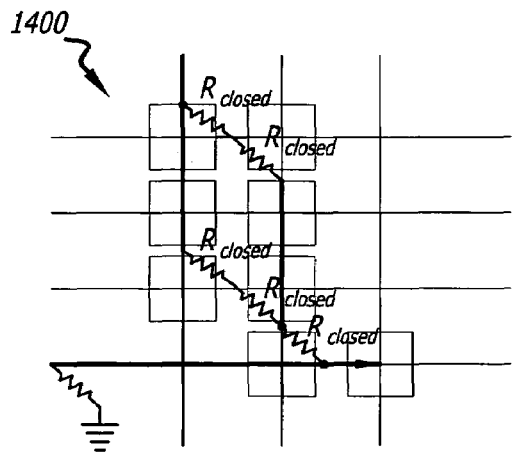
FIG. 14 depicts an approximate equivalent circuit when computing wired-AND as in FIG. 13D.
Figure 15:
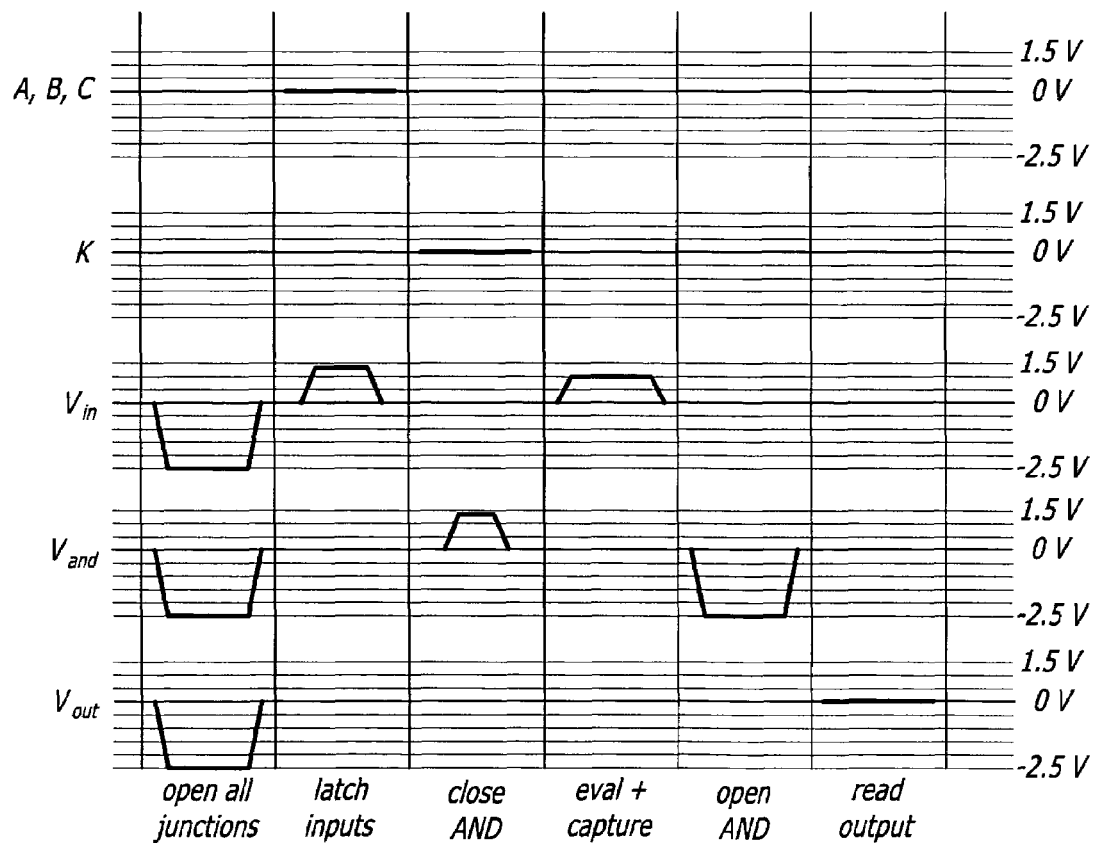
FIG. 15 is a plot of control signals for the NAND gate of FIG. 14.

FIGS. 13A–13F illustrates steps in computing a NAND function with hysteretic logic according to an example embodiment. FIG. 14 depicts an approximate equivalent circuit 1400 when computing wired-AND (FIG. 13D). The impedance of the voltage source driving K (and, in fact, all of the inputs) is 3 times the $R_{closed}$ resistance to model the effect of intermediate junctions being used to route signals to the latch inputs (see below under the section entitled "Multiple Crossbars"). FIG. 15 is a plot of control signals for the NAND gate of FIG. 14.

Referring to FIGS. 12B, 13A-13F, 14 and 15, an example procedure for executing a NAND function includes the following steps:

1. All junctions are unconditionally opened by driving the $V_{in}$, $V_{and}$ and $V_{out}$ control lines with negative voltages (FIG. 13A).
2. Input data (A, B, C) are latched in the input latches by driving $V_{in}$ with a positive voltage (FIG. 13B).
3. Some of the wired-AND junctions (middle column of FIG. 12B) are closed by driving $V_{in}$ with ground, K with a low impedance path to ground, and $V_{and}$ with a positive voltage. The only junctions along the $V_{and}$ wire that will actually be closed are those with a low impedance path to ground through a closed junction in an input latch junction (FIG. 13C).
4. The input latches are read, the wired-AND function is evaluated and the result captured in the output latch. The "K" input on the lowest horizontal nanowire in FIG. 12B is sourced from a latch holding a logic 0 (closed), forming a voltage divider with the resistors in the first two columns (see FIG. 14 and FIG. 13D).
5. The wired-AND junctions are all opened by driving $V_{and}$ with a negative voltage (FIG. 13E).
6. The result is driven out of the output latch by driving ground onto the $V_{out}$ line. If desired, the latched inputs can also be driven out at the same time by driving ground onto the $V_{in}$ line (FIG. 13F).

Because of the impedance encoding, the "wired-AND" is robust and can tolerate a large number of inputs as long as $R_{open}$ is much greater than $R_{closed}$. Thus, the principles described herein allow high fan-in AND gates to be implemented by tying together the outputs of multiple latches.

Sum-of-Products

The combination of the ability to compute the AND function along with the ability to invert signals with the latch provides the ability to perform universal computation: crossbars can be combined with latches to implement arbitrary logic. However, such an approach does not best take advantage of the crossbar structure, which is also capable of implementing general sum-of-products logic functions in an efficient manner.

Figures 16, 17:
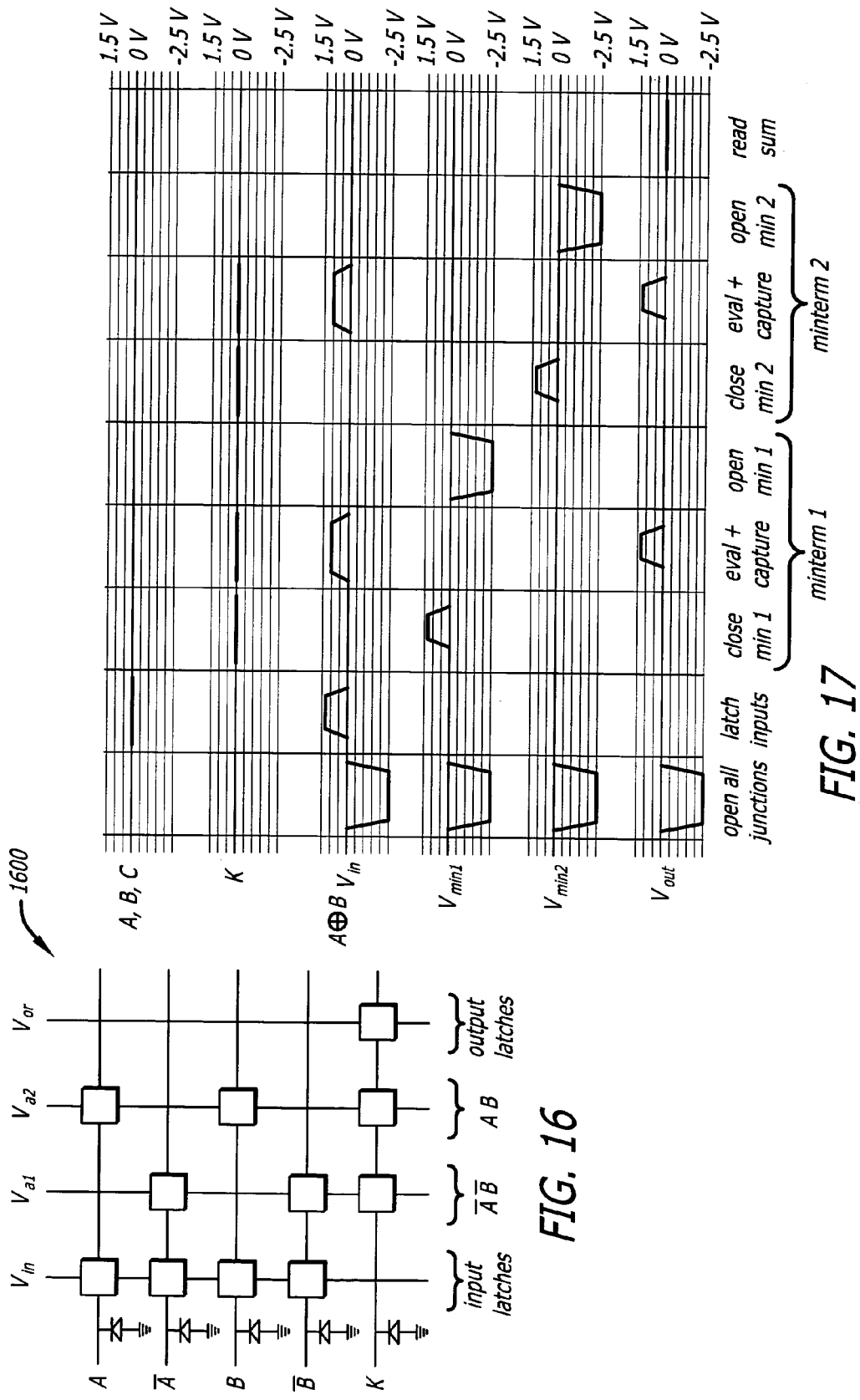
FIG. 16 illustrates implementation of an exclusive OR gate in a crossbar according to an example embodiment.
FIG. 17 is a plot of control signals for the exclusive OR gate of FIG. 16.

FIG. 16 illustrates implementation of an exclusive OR gate in a crossbar 1600 according to an example embodiment. FIG. 17 is a plot of control signals for the exclusive OR gate of FIG. 16. This example implementation of an exclusive OR gate involves OR-ing together two different minterms (FIG. 16). Its operation is similar to the NAND gate, except that three additional steps are required for the evaluation of the second minterm. Referring to FIGS. 16 and 17, an example procedure for executing an exclusive OR function includes the following steps:

1. All junctions are unconditionally opened.
2. Input data are latched in the input latches. After latching, the drivers of the inputs signals are put into the high impedance state.
3. The wired-AND junctions for the first minterm are closed if the corresponding stored bit in the input latch is logic 0 (closed).
4. The input latches are read, the wired-AND function is evaluated, and the result captured in the output latch.
5. The wired-AND junctions for the first minterm are opened.
6. The wired-AND junctions for the second minterm are closed if the stored bit in the corresponding input latch is logic 0.
7. The input latches are read, the wired-AND function is evaluated, and the result captured in the output latch. It should be noted that the output latch may have already been set into the closed position in step 4 when the result of the first minterm was captured. If so, this step will have no effect, otherwise the latch will capture the output of the second minterm. This effectively NOR's the two minterms together (the NOR-ing is done sequentially rather than concurrently).
8. The wired-AND junctions for the second minterm are opened.
9. The result is driven out of the output latch (this latch is inverting because of the input voltage divider configuration).

Multiple Outputs

Figure 18:
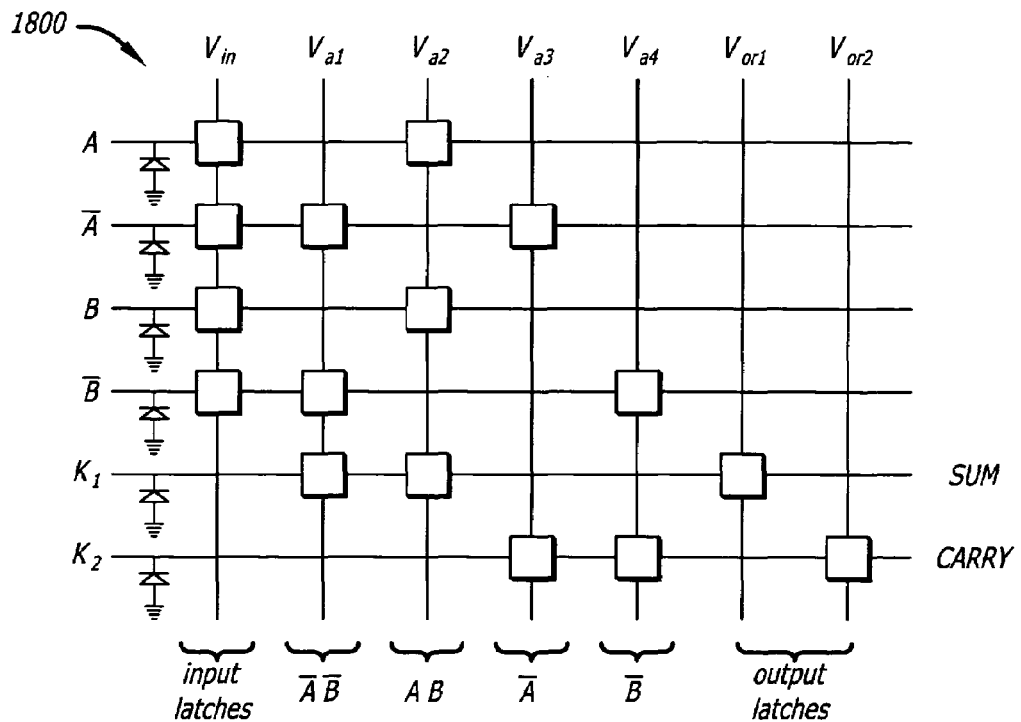
FIG. 18 illustrates implementation of a half adder circuit in a crossbar according to an example embodiment.

The efficiency of the crossbar can be further improved by adding additional minterms and output latches. To this end, FIG. 18 illustrates implementation of a half adder circuit in a crossbar 1800 according to an example embodiment. In this example, the half adder produces the sum and carry of two inputs, A and B.

Multiple Crossbars

Figure 19:
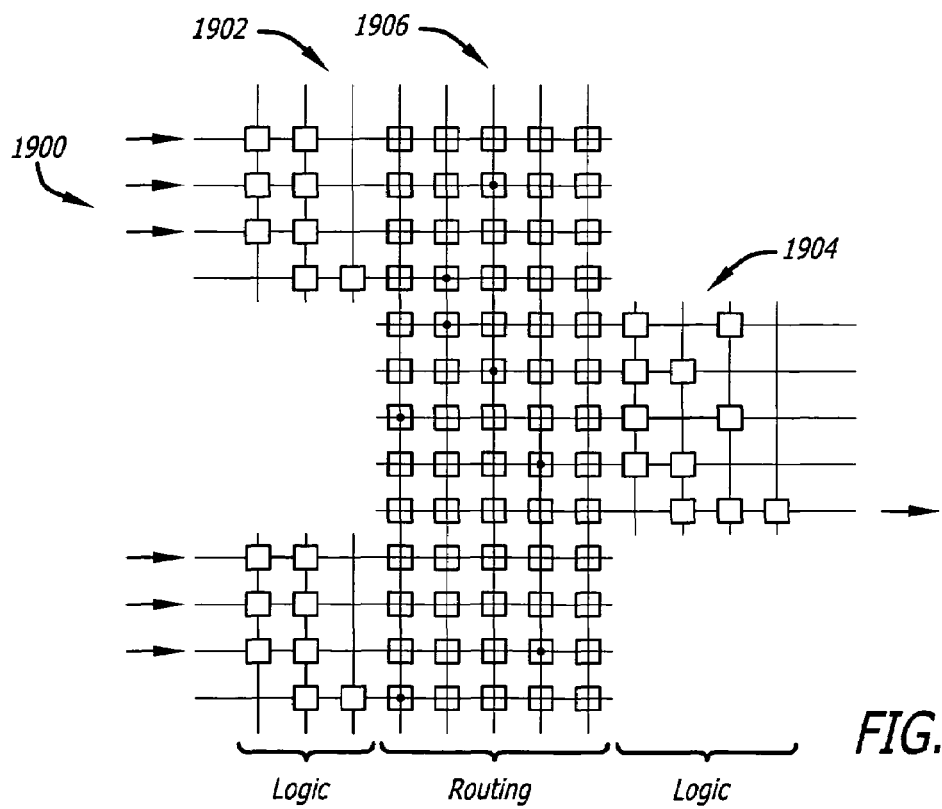
FIG. 19 illustrates implementation of an architecture including both logic and routing crossbars according to an example embodiment.

More complex logic functions can be implemented by combining several crossbars, using some of the crossbars for implementing logic and some for implementing routing. By way of example, FIG. 19 illustrates an architecture 1900 including logic crossbars 1902 and 1904 and a routing crossbar 1906 configured as shown. In this example, the crossbar in the middle is used strictly for routing—the closed junctions in the routing crossbar 1906 are configured once and left to route signals from the output of the logic blocks on the left (logic crossbar 1902) to the logic block on the right (logic crossbar 1904).

Although the present invention has been described in terms of the example embodiments above, numerous modifications and/or additions to the above-described embodiments would be readily apparent to one skilled in the art. It is intended that the scope of the present invention extends to all such modifications and/or additions.

I claim:

1. An architecture for computing, comprising:
nanometer scale crossbar switches configured to perform a logical function in response to a sequence of pulses that encode logic values in the nanometer scale crossbar switches as impedances, wherein input data is latched at input latches within the nanometer scale crossbar switches and wire-AND junctions are open/closed with the result being driven out of an output latch.

2. The architecture for computing of claim 1, wherein the nanometer scale crossbar switches are configured to perform a latching function in response to the sequence of pulses.

3. The architecture for computing of claim 1, wherein the nanometer scale crossbar switches include a common type of programmable switch junction.

4. The architecture for computing of claim 3, wherein the programmable switch junctions have substantially linear impedance responses when closed.

5. The architecture for computing of claim 3, wherein the programmable switch junctions are resistive.

6. The architecture for computing of claim 1, wherein the architecture does not include diodes.

7. The architecture for computing of claim 1, wherein the architecture does not include transistors.

8. The architecture for computing of claim 1, wherein the nanometer scale crossbar switches include two wires that are crossed at a non-zero angle.

9. The architecture for computing of claim 8, wherein one or both of the two wires are made from a metal.

10. The architecture for computing of claim 8, wherein one of the two wires is made from a semiconductor material.

11. An architecture for computing, comprising:
a plurality of nanometer scale crossbar switches which serve as resistive circuit elements when in closed positions, the nanometer scale cross bar switches being configured to perform a logical function in response to a sequence of control inputs that encode logic values in the nanometer scale crossbar switches as impedances, wherein input data is latched at input latches within the plurality of nanometer scale crossbar switches and wire-AND junctions are open/closed with the result being driven out of an output latch.

12. The architecture for computing of claim 11, wherein the nanometer scale switches include crossbar switches.

13. The architecture for computing of claim 12, wherein the crossbar switches include two wires that are crossed at a non-zero angle.

14. The architecture for computing of claim 13, wherein one or both of the two wires are made from a metal.

15. The architecture for computing of claim 13, wherein one of the two wires is made from a semiconductor material.

16. The architecture for computing of claim 11, wherein the nanometer scale switches are configured to perform a latching function in response to the sequence of control inputs.

17. The architecture for computing of claim 11, wherein the nanometer scale switches do not include diodes.

18. The architecture for computing of claim 11, wherein the nanometer scale switches do not include transistors.

19. An architecture for computing, comprising:
arrays of nanometer scale crossbar switches that are uniform in type and that include a common type of programmable switch junctions, the arrays being configured to implement a logic function by encoding logic values in the arrays as impedances, wherein input data is latched at input latches within the arrays of nanometer scale crossbar switches and wire-AND junctions are open/closed with the result being driven out of an output latch.

20. The architecture for computing of claim 19, wherein the arrays are configured to perform a latching function.

21. The architecture for computing of claim 19, wherein the switch junctions are nanometer scale.

22. The architecture for computing of claim 19, wherein the switch junctions have substantially linear impedance responses.

23. The architecture for computing of claim 19, wherein the switch junctions are resistive.

24. The architecture for computing of claim 19, wherein the arrays do not include diodes.

25. The architecture for computing of claim 19, wherein the arrays do not include transistors.

26. The architecture for computing of claim 19, wherein the architecture is formed on a single tile type.

27. A method for computing, comprising:
providing a sequence of pulses that encodes logic values in arrays of crossbar switches as impedances such that the arrays perform logical functions, wherein input data is latched at input latches within the arrays of nanometer scale crossbar switches and wire-AND junctions are open/closed with the result being driven out of an output latch.

28. The method for computing of claim 27, wherein the arrays arc uniform in type.

29. The method for computing of claim 27, wherein the arrays include a common type of programmable switch junction.

30. The method for computing of claim 27, wherein the arrays include nanometer scale switch junctions.

31. The method for computing of claim 27, wherein the arrays do not include diodes.

32. The method for computing of claim 27, wherein the arrays do not include transistors.

33. The method for computing of claim 27, wherein the logical functions include a NAND function.

34. The method for computing of claim 27, wherein the logical functions include an exclusive OR function.

35. A method for computing comprising:
providing a sequence of pulses that allows an array of resistor crossbar switches to perform a logical function, the sequence of pulses being provided to effect a sequence of operations wherein
all junctions of the resistor crossbar switches are unconditionally opened, input data are latched in input latches of the array,
wired-AND junctions of the array are closed,
the input latches are read, and a wired-AND function is evaluated and a result captured in an output latch of the array,
the wired-AND junctions are opened, and
the result is driven Out of the output latch.

36. A method for computing comprising:
providing a sequence of pulses that allows an array of resistor crossbar switches to perform a logical function, the sequence of pulses being provided to effect a sequence of operations wherein
all junctions of the resistor crossbar switches are unconditionally opened,
input data are latched in input latches of the array,
wired-AND junctions of the array for a first minterm are closed depending upon a corresponding first minterm bit stored in the input latches,
the input latches are read, and a wired-AND function is evaluated and a first minterm result captured in an output latch of the array,
the wired-AND junctions for the first minterm are opened,
the first minterm result is driven out of the output latch,
wired-AND junctions of the array for a second minterm are closed depending upon a corresponding second minterm bit stored in the input latches,
the input latches are read, and the wired-AND function is evaluated and a second minterm result captured in the output latch, which effectively NORs the first and second minterms together,
the wired-AND junctions for the second minterm are opened, and
a result of the first and second minterms NORed together is driven out of the output latch.

* * * * *

UNITED STATES PATENT AND TRADEMARK OFFICE
CERTIFICATE OF CORRECTION

PATENT NO. : 7,203,789 B2
APPLICATION NO. : 10/842762
DATED : April 10, 2007
INVENTOR(S) : Gregory Stuart Snider It is certified that error appears in the above-identified patent and that said Letters Patent is hereby corrected as shown below:

In column 11, line 49, in Claim 9, delete "ftom" and insert -- from --, therefor.

In column 12, line 47, in Claim 28, delete "arc" and insert -- are --, therefor.

In column 13, line 7, in Claim 35, delete "Out" and insert -- out --, therefor.

Signed and Sealed this

Sixth Day of October, 2009

David J. Kappos
*Director of the United States Patent and Trademark Office*